United States Patent
Gale et al.

[11] 3,945,825
[45] Mar. 23, 1976

[54] METHOD FOR PRODUCING WIDTH-MODULATED SURFACE RELIEF PATTERNS

[75] Inventors: Michael Thomas Gale, Gattikon, Switzerland; Arthur Herbert Firester, Skillman, N.J.

[73] Assignee: RCA Corporation, New York, N.Y.

[22] Filed: May 22, 1974

[21] Appl. No.: 472,436

[52] U.S. Cl. .................. 96/27 H; 96/36; 96/38.3; 156/8; 156/15; 156/18; 350/3.5
[51] Int. Cl.² ................. G03C 5/04; G02B 3/00
[58] Field of Search .................. 96/27 H, 36, 38.3; 350/3.5, 162 R; 156/8, 15, 18

[56] References Cited
UNITED STATES PATENTS

| | | | |
|---|---|---|---|
| 3,388,735 | 6/1968 | Sayce | 350/162 R |
| 3,580,657 | 5/1971 | Sheridon | 350/3.5 |
| 3,623,798 | 11/1971 | Sheridon | 350/162 |
| 3,669,673 | 6/1972 | Senih et al. | 96/27 H |
| 3,733,258 | 5/1973 | Hanak et al. | 204/192 |
| 3,743,507 | 7/1973 | Senih et al. | 96/38.3 |

*Primary Examiner*—Edward C. Kimlin
*Attorney, Agent, or Firm*—Edward J. Norton; George J. Seligsohn

[57] ABSTRACT

Pulse width modulated surface relief phase holograms are produced on a substrate by developing a holographic interference pattern recorded on a photoresist deposited on the surface of said substrate as an amplitude modulated sinusoidal surface relief pattern so as to expose the surface of said substrate as a function of the intensity of said interference pattern, uniformly etching said substrate and removing said photoresist leaving a pulse width modulated, substantially two-level rectangular wave diffraction grating. Focused image holograms produced by this method on hard durable substrates may be used as masters for replicating said holograms in a suitable recording medium.

12 Claims, 3 Drawing Figures

METHOD FOR PRODUCING WIDTH-MODULATED SURFACE RELIEF PATTERNS

FIELD OF THE INVENTION

This invention relates to recording a holographic interference pattern as a fine detail pulse width modulated grating structure and the production of pulse width modulated holograms from amplitude modulated sinusoidal interference patterns. More particularly, this invention relates to producing a focused image hologram recorded as a pulse width modulated, two-level grating structure in a hard durable substrate from an amplitude modulated, sinusoidal interference pattern recorded in a photoresist on said substrate and using said grating structure as a master for replicating said focused image hologram or as a medium for permanent storage of information for archival purposes.

BACKGROUND OF THE INVENTION

Since conventional microfilm and microfiche deteriorate with time, recording information on a permanent medium as a surface relief pattern is a desireable means for storing information for archival purposes.

If a photoresist is used as the recording medium for a surface relief focused image hologram, the resulting phase hologram is recorded as an amplitude modulated, sinusoidal surface relief pattern on the surface of the photoresist. Since conventional photoresist materials are soft, it is often necessary to use techniques similar to those outlined in U.S. Pat. No. 3,565,978 to replicate the hologram in a hard material suitable for use as a master. This technique involves a metal plating procedure in which a metal film is built up on the resist surface and subsequently separated from the resist to form a metal master for replicating the hologram. Great care and precision are required to transfer the surface relief pattern to the metal master without distortion since the relief pattern dimensions are on the order of 1 micron.

Another technique for duplicating surface relief phase holograms involves etching the surface relief pattern recorded on a photoresist into a hard durable substrate material underlying the photoresist and the use of this substrate as a master for replicating the hologram in a suitable medium, e.g., a thermoplastic. U.S. Pat. No. 3,733,258 describes such a process using sputter-etching techniques. The substrate also may be etched by chemical etching techniques.

Conventional techniques described above for replicating surface relief focused image holograms are often uneconomical for reproducing small numbers, i.e., a few thousand copies of the holograms, due to the expense involved in producing the master. Therefore, it is highly desired to develop a quick, economical method for making masters for surface relief holograms.

DISCUSSION OF THE PRIOR ART

Focused image holograms, disclosed in U.S. Pat. No. 3,535,012, and pulse width diffraction gratings are well known in optics. Recording information on a width modulated diffraction grating is described in U.S. Pat. No. 3,688,025; pulse modulation of spatial optical signals, including holographic signals, is discussed by A. W. Lohman and H. W. Werlich, Appl. Opt.. 10, 2743 (1971). Forming diffraction gratings in a photoresist by the optical interference of two coherent light beams and transferring the same to a substrate also is known to practitioners of the art.

SUMMARY OF THE INVENTION

It has been discovered that pulse width modulated holograms, e.g., focused image holograms, may be produced by recording an interference pattern in a photoresist deposited on a substrate as an amplitude modulated sinusoidal surface relief pattern, developing said amplitude modulated sinusoidal surface relief pattern so as to expose the surface of said substrate as a function of the intensity of said interference pattern, and etching said substrate so as to develop a rectangular wave, pulse width modulated, diffraction grating on said substrate. The substrate is preferably a hard durable material so that the rectangular wave, pulse width modulated diffraction grating recorded in this material may be used as a master to replicate a focused image hologram. This process may be used to produce pulse width modulated diffraction gratings for any purpose.

DRAWINGS

DESCRIPTION OF THE PREFERRED EMBODIMENT

Figure 1:
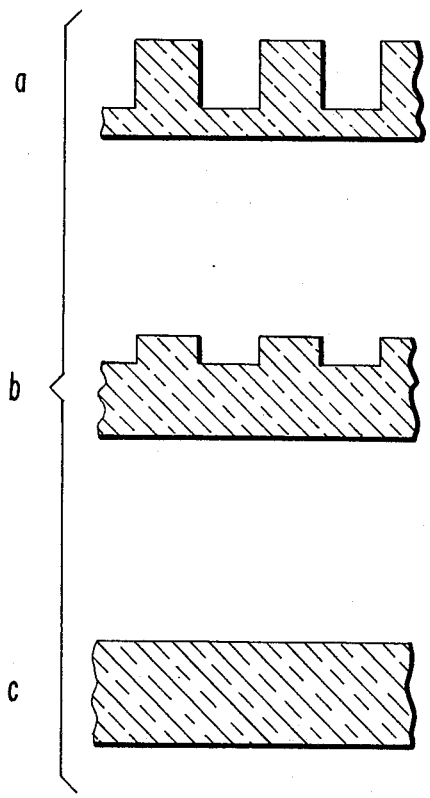
FIG. 1 illustrates a grey scale for amplitude modulated diffraction gratings.
Figure 2:
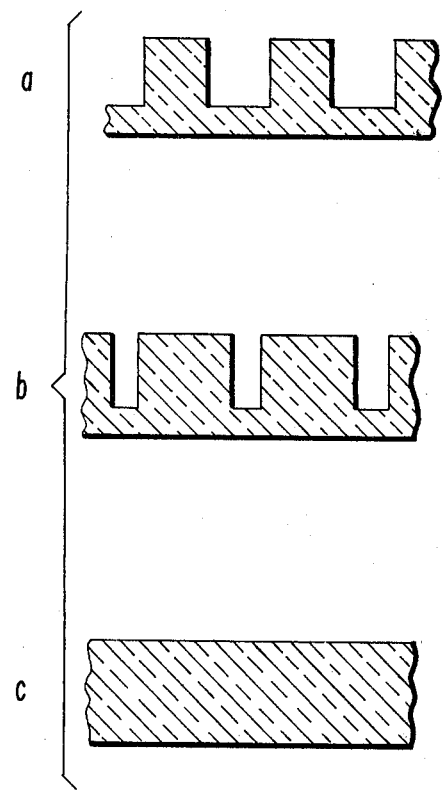
FIG. 2 illustrates a corresponding grey scale for a pulse width modulated, two level diffraction grating.

FIGS. 1 and 2 compare a grey scale for an amplitude modulated, rectangular wave diffraction grating with a corresponding grey scale for a pulse width modulated, rectangular wave diffraction grating respectively. FIGS. 1 and 2 are prior art and used for illustrative purposes. A rectangular wave diffraction grating is a diffraction grating whose cross section is substantially rectangular. A "bright" area, i.e., an area of maximum efficiency where the line-space ratio is unity, is shown by FIG. 1(a) for an amplitude modulated, rectangular wave diffraction grating and by FIG. 2(a) for a pulse width modulated, rectangular wave diffraction grating. FIGS. 1(b) and 2(b) illustrate a "grey" area, i.e., an area of intermediate efficiency, for an amplitude modulated rectangular wave diffraction grating and a pulse width modulated, rectangular wave diffraction grating respectively. A "black" area, i.e., an area of zero efficiency, is shown in FIG. 1(c) for an amplitude modulated, rectangular wave diffraction grating and by FIG. 2(c) for a pulse width modulated, rectangular wave diffraction grating. The efficiency of an area is defined by the ratio of the radiant flux diffracted into the reconstruction beam to the incident flux of the reconstructing beam.

A diffraction grating also can be used to record color images by producing three overlapping phase gratings, each grating separately encoding the interference pattern produced from the image in one of the three primary colors.

Figure 3:
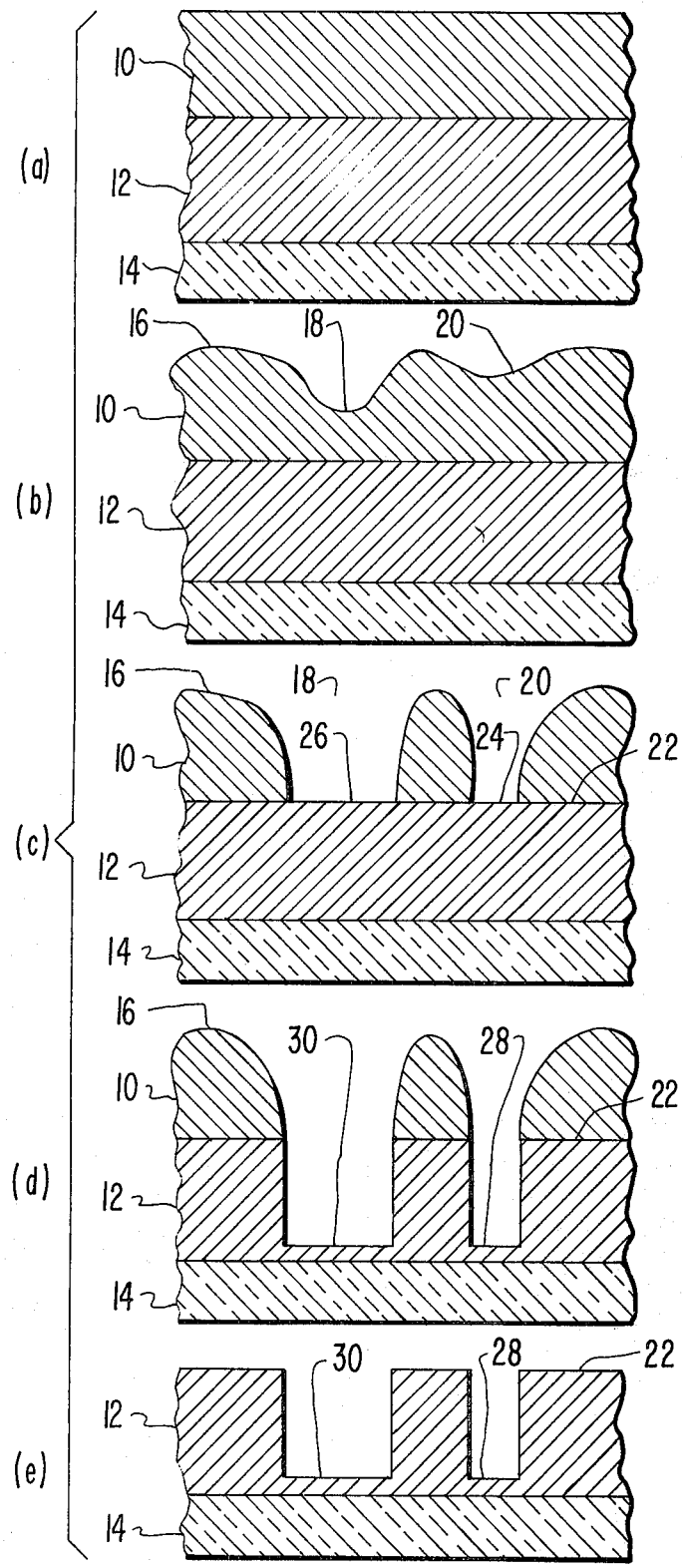
FIG. 3 illustrates the sequence for converting an interference pattern recorded in a photoresist as an amplitude modulated sinusoidal surface relief pattern into a pulse width modulated, two-level diffraction grating.

FIG. 3 illustrates the sequence for converting an interference pattern developed in a photoresist as an amplitude modulated sinusoidal surface relief pattern into a pulse width modulated, two-level diffraction grating. Referring now to FIG. 3(a), a thin, uniform film 10 of a photoresist, e.g., a Shipley AZ 1350 positive photoresist produced by the Shipley Company, is applied to the surface of a substrate 12. The substrate 12 may be a 1 μm thick molybdenum film deposited on a glass plate. Other substrate materials which may be used include glass, plastic, and metal and metal oxide films. The thickness of the photoresist film 10 should be about 5,000 A and should be uniform to ± 100 A. There are a large number of positive and negative photoresists and photoresist developers widely known to those skilled in the art which can be used in the present invention. The photoresist 10 is exposed to a holographic interference pattern, e.g., a focused image holographic interference pattern. The focused image holographic interference pattern may be considered as a sinusoidal grating intensity pattern with an amplitude varying with the transmission of the object transparency. The exposed photoresist film 10 is developed by an approximately linear developer, such as a Shipley AZ 303 developer produced by the Shipley Company. Depending upon the range of amplitudes of the exposing interference pattern the photoresist may preferably be developed by a non-linear developer, such as a Shipley AZ 1350 developer produced by Shipley Company. FIG. 3(b) illustrates the positive photoresist during development. During development of a positive photoresist film 10 is removed at a rate dependent upon the local exposure of the sinusoidal surface relief pattern. The unexposed area 16 of the photoresist film 10 is etched away considerably more slowly than the exposed areas 18 and 20. The rate of development of the sinusoidal relief pattern is dependent upon the intensity of the exposure of the photoresist by the interference pattern. A more intensely exposed area 18 of the photoresist develops, i.e., is removed, quicker than a less intensely exposed area 20. Referring now to FIG. 3(c) the photoresist film is developed, i.e., dissolved, until the "valleys" 18 and 20 expose the surface 22 of the substrate 12. The valleys 18 and 20 in the developing sinusoidal relief pattern cut through to the surface 22 of the substrate 12 first in the area 18 of maximum exposure. The development progress may be conveniently monitored using a microscope equipped with a red filter since the Shipley photoresist is insensitive to red light. Development is continued until the line width of the revealed substrate in the bright areas, i.e., the maximum diffraction efficiency required, is equal to the line width of the masked substrate. As a result of this development the area 20 which was less intensely exposed to the interference pattern than another area 18 reveals an area 24 on the surface 22 of substrate 12 having a substantially proportionately narrower line width than the line width of the area 26 revealed by the more intensely exposed area 18. While in most cases the line width of the revealed area 24 and 26 will be in substantially direct proportion to the intensity of the interference pattern which exposed the overlying photoresist areas 18 and 20, it is sufficient that the line width of the revealed areas 24 and 26 be a function of the intensity of the interference pattern to transfer the spatial holographic information from the photoresist onto the underlying substrate as a pulse width modulated grating structure, e.g., the pulse width modulated grating can be developed inversely proportional to the intensity of the holographic interference pattern or as a logarithmic function of the intensity of the holographic interference pattern.

The revealed substrate surfaces 24 and 26 are now etched by a predetermined amount to form a rectangular wave grating in the substrate 12. The etching may be accomplished by chemical etching or sputter-etching techniques. FIG. 3(d) illustrates the etched substrate 12 with valleys 28 and 30. The optimum depth for the valleys 28 and 30 is about 5,000 A.

The first order efficiency $N$ of a rectangular phase grating can be considered to be $$N = \frac{4}{\pi^2} \sin^2\left(\frac{\phi_o}{2}\right) \sin^2\left(\pi \cdot \left(\frac{a}{D}\right)\right)$$

where $a$ is equal to the line width of the grating, $D$ is equal to the period of the grating, and $\phi_o$ is the phase depth, i.e., optical depth of the grating in the recording material. The maximum efficiency (about 40%) may be considered to result when $$a = \frac{D}{2} \text{ (a square wave grating)}$$

and $$\phi_o = \pi \text{ (the optimum phase depth)}.$$

The optimum depth of the grating $d$ may be considered to relate to the refractive index $\mu$ of the final recording medium, e.g., a thermoplastic such as vinyl tape, and the wavelength of the reconstructing light $\lambda$ by $$2\pi(\mu-1)d = \phi_o = \pi$$

$$d = \frac{\lambda}{2(\mu-1)} \text{(for maximum efficiency)}$$

Thus, for $\mu = 1.5$, $d$ would range from 4,600 A (for blue light) to 6,500 A (for red light). The grating periodicity $D$ is generally determined by the geometry of the read-out system, i.e., the read-out angle, grating orientation and encoding scheme. In practice it would generally be in the range 1–10 μm.

The photoresist 10 is removed by a photoresist remover, such as acetone, leaving a phase hologram recorded in the substrate 12 as a pulse width modulated, substantially two-level diffraction grating as illustrated in FIG. 3(e). When a suitably hard substrate, e.g., glass or a metal film, is used the diffraction grating structure can be used as a master for replication of the hologram.

Often it is difficult using linear development to record the full range of object intensities of an interference pattern when these intensities vary greatly from each other, i.e., the full grey scale of the object. This difficulty may be overcome by non-linear development of the photoresist, i.e., developing the resist with a non-linear developer, such as a Shipley AZ 1,350 developer. The required intensity distribution for an interference pattern also can be obtained by exposing the photoresist to a constant uniform weak grating biased by a more intense, incoherent object exposure and using a non-linear development. This technique gives a pulse width modulated hologram with full grey scale and can be used to construct a negative of the original interference pattern, that is a diffraction grating where the area of maximum efficiency, i.e., where the line to space ratio is unity, results in the area of minimal exposure intensity. A similar result can be obtained by following the standard focused image holographic interference pattern exposure with a further exposure using the object beam only.

This technique is particularly useful in producing focused image holograms; however, it may be applied to any type of system where it is sought to transfer information recorded in a photoresist as an amplitude modulated, sinusoidal relief pattern into a pulse width modulated, substantially two-level diffraction grating relief structure.

The above technique may be used to develop a pulse width modulated focused image hologram in a wide variety of substrates. Since difficulty is often encountered adhering a suitable photoresist to a glass substrate, it is often necessary to first apply a thin metal film, such as chromium, to the glass substrate surface prior to application of the photoresist. This is accomplished by coating the glass substrate with a thin film of a metal, e.g., chromium 800 A thick, depositing a photoresist on the metal film, exposing and developing the photoresist as described above, etching away the revealed metal film to expose the glass substrate, etching the exposed glass to an optimum depth using dilute hydrofluoric acid, and removing the remaining resist and metal film leaving a pulse width modulated, two-level diffraction grating phase hologram recorded in the glass substrate.

Another variation of the basic technique is to cover a suitable substrate with a thin film of an amorphous material such as a metal oxide. The film thickness is chosen to equal the optimum depth modulation required in the final focused image hologram, i.e., normally about 5,000 A. The film is coated with a photoresist and the photoresist is exposed and developed as described above. The exposed thin film is etched away completely using an etch which does not attack the substrate. The remaining resist is then removed leaving a pulse width modulated, substantially two-level diffraction grating focused image phase hologram recorded in the thin metal film. The advantage of this variation is that precise control of the etching stage is no longer critical to obtain the correct depth modulation and a greater flexibility exists in the choice of materials to be etched.

The present invention will be further illustrated by the following examples, but it is to be understood that the invention is not meant to be limited to the details described therein.

EXAMPLE 1

A 5,000 A thick film of chromium was evaporated onto a clean glass substrate. A 1 μm thick coat of molybdenum was deposited on the chromium film. The molybdenum clad glass substrate was coated with a 5,000 A ± 100 A thick film of Shipley AZ 1350 photoresist by spinning the glass at 3,000 rpm for 30 seconds. The plate was baked at 75°C. for 1 hour. Then the photoresist was holographically exposed using laser light having a wavelength of 4,416 A. The optimum exposure was approximately 0.1 joule/cm$^2$. The photoresist was developed by immersion in a Shipley AZ 303 photoresist developer diluted 1:8 in water for several minutes. Development was monitored with a red light microscope. When the line width of the revealed substrate in an area of the maximum diffraction efficiency required was equal to the line width of the masked substrate, development was stopped and the plate was rinsed in water and dried. The molybdenum film was etched for about 15 seconds to the proper depth, about 5,000 A, in an etch of a mixture of 1 part by volume nitric acid, 1 part by volume sulphuric acid and 5 parts by volume water. The photoresist was stripped off the plate by washing the plate in acetone. The plate was then ready for use as a master to replicate the surface relief hologram in a suitable medium.

EXAMPLE 2

A 700 A thick pinhole-free film of chromium was evaporated onto a clean glass plate. The photoresist was deposited, baked, exposed, and developed as described in Example 1. The exposed chromium film was etched away using a chromium etch comprising 200 ml of 42° Baume ferric chloride solution and 100 ml of concentrated hydrochloric acid. The temperature of the chromium etch bath was 80°C. The glass was etched to an optimum depth of approximately 5000 A by immersion in a 4% aqueous solution of hydrofluoric acid for 1½ minutes. After the glass was etched to the optimum depth, the photoresist was removed with acetone. The remaining chromium film was removed using the chromium etch described above. The glass plate was rinsed in water and dried. The glass plate was now ready for use as a master.

EXAMPLE 3

A 5,000 A thick film of iron oxide was deposited on a glass plate. A Shipley AZ 1,350 photoresist was deposited and developed as described in Example 1 to reveal the iron oxide film. The iron oxide film was etched through to the glass substrate in a solution of 775 cc of concentrated hydrochloric acid, 223 cc of water and 166 gms. ferrous chloride. The photoresist was stripped off the iron oxide film by washing the plate in acetone leaving a pulse width modulated, two-level, square wave diffraction grating recording the interference pattern in the iron oxide substrate.

What is claimed is:

1. A method for producing a width-modulated surface relief pattern in the surface of a substrate that is covered with a coating of substantially uniform thickness of photoresist, said method comprising the steps of:
   a. exposing the photoresist to surface radiation including an interference pattern,
   b. developing the exposed photoresist just sufficiently to produce an amplitude-modulated surface relief pattern which reveals only certain portions of the surface of the substrate as a function of the spatial distribution of the relative intensity of said surface radiation,
   c. etching only the revealed certain portions of said substrate to form a width-modulated wave grating of substantially rectangular cross section and substantially uniform depth in the substrate, and
   d. only then removing the photoresist from the now-revealed remainder of the substrate.

2. The method of claim 1 wherein said surface radiation comprises a focused image holographic interference pattern.

3. The method of claim 1 wherein said etching is produced by chemical etching.

4. The method of claim 1 wherein said etching is produced by sputter-etching.

5. The method of claim 1 wherein said photoresist is exposed to a substantially constant, substantially uniform weak grating pattern biased by a more intense, incoherent object pattern prior to exposure to said interference pattern.

6. The method of claim 5 wherein said development is substantially non-linear.

7. The method of claim 1 wherein said development is substantially linear.

8. The method of claim 1 wherein said development is substantially non-linear.

9. The method of claim 1 wherein said photoresist is exposed to surface radiation comprising a focused image of an object after exposure to said interference pattern.

10. The method of claim 1 wherein said substrate is a hard durable substrate capable of being used as a master for replicating said width modulated surface relief pattern by hot pressing of a thermoplastic medium.

11. The method of claim 10 wherein said substrate is etched to an optimum depth which is a direct function of the wavelength of the exposing surface radiation and an inverse function of the index of refraction of said thermoplastic medium.

12. A method for producing a width-modulated surface relief pattern comprising the steps of:
   a. depositing a thin amorphous film on a substrate,
   b. coating said film with a substantially uniform thickness of photoresist,
   c. exposing said photoresist to surface radiation including an interference pattern,
   d. developing said exposed photoresist just sufficiently to produce an amplitude-modulated surface relief pattern which reveals only certain portions of the surface of the thin film as a function of the spatial distribution of the relative intensity of said surface radiation,
   e. etching only the revealed certain portions of said thin film to form a width-modulated wave grating of substantially rectangular cross section and substantially uniform depth in said thin film, and
   f. only then removing the photoresist from the non-revealed remainder of the thin film.

* * * * *